(12) United States Patent
Cao

(10) Patent No.: US 7,679,460 B2
(45) Date of Patent: Mar. 16, 2010

(54) CRYSTAL OSCILLATOR TESTER

(75) Inventor: Xiang Cao, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/212,659

(22) Filed: Sep. 18, 2008

(65) Prior Publication Data

US 2010/0033254 A1    Feb. 11, 2010

(30) Foreign Application Priority Data

Aug. 11, 2008    (CN) .................. 2008 1 0303656

(51) Int. Cl.
*H03B 1/00* (2006.01)
*G01R 29/22* (2006.01)
*G01R 23/00* (2006.01)

(52) U.S. Cl. .................. 331/64; 331/44; 331/116 R; 331/158; 331/74; 324/727

(58) Field of Classification Search .................. 331/64, 331/44, 116 R, 116 FE, 158, 74; 324/727; 368/159

See application file for complete search history.

(56) References Cited

U.S. PATENT DOCUMENTS

| 2,463,616 | A  | * | 3/1949  | Harrison ..................... 324/727 |
| 6,480,010 | B2 | * | 11/2002 | Ikuta et al. .................. 324/727 |
| 6,480,073 | B2 | * | 11/2002 | Ushiyama .................... 331/158 |
| 7,443,253 | B2 | * | 10/2008 | Chen .......................... 331/74 |

FOREIGN PATENT DOCUMENTS

| JP | 59132372 A | * | 7/1984 |
| JP | 62247276 A | * | 10/1987 |
| TW | 485242 A   | * | 5/2002 |

* cited by examiner

*Primary Examiner*—Robert Pascal
*Assistant Examiner*—Ryan J. Johnson
(74) *Attorney, Agent, or Firm*—Zhigang Ma

(57) ABSTRACT

A crystal oscillator tester includes first and second test pins, first and second transistors, an indicator, a first diode, and first-third capacitors. The first test pin is connected to a power source. The collector of the first transistor is connected to the first test pin. The base of the second transistor is connected to the second test pin. The emitter of the first transistor is grounded via the indicator. The base of the first transistor is connected to the cathode of the first diode. The anode of the first diode is connected to the first test pin via the first and second capacitors one by one in series. The emitter of the second transistor is connected to a node between the first and second capacitors. The collector of the second transistor is grounded. The third capacitor is connected between the base and emitter of the second transistor.

10 Claims, 2 Drawing Sheets

CRYSTAL OSCILLATOR TESTER

BACKGROUND

1. Field of the Invention

The present disclosure relates to testers, and particularly, to a tester for testing crystal oscillators.

2. Description of Related Art

Nowadays, crystal oscillators are widely used in electronic devices to supply frequency signals. A typical testing method to test a crystal oscillator is using an oscillograph to detect a frequency of the crystal oscillator, however this method is not exact or accurate enough.

What is needed is to provide a more precise system to test crystal oscillators.

DETAILED DESCRIPTION

Figure 1:
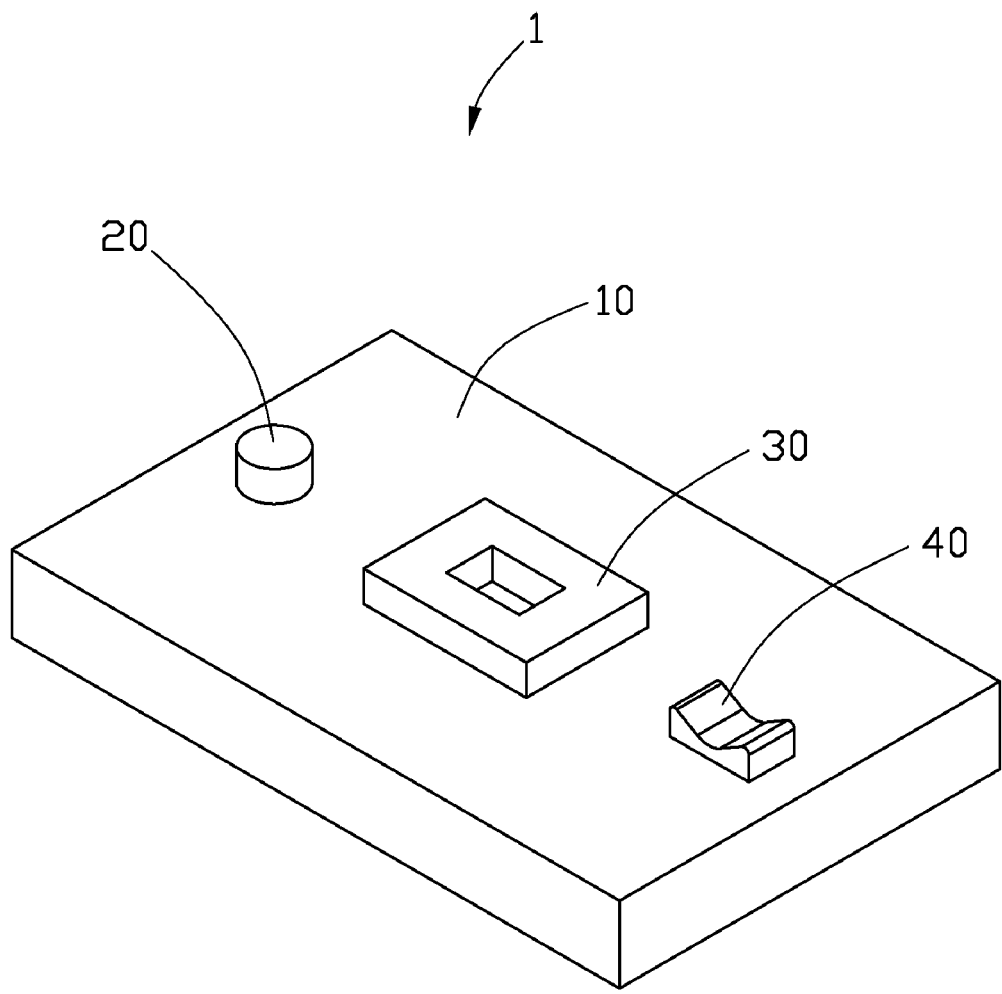
FIG. 1 is an isometric, schematic view of one embodiment of a crystal oscillator tester of the present disclosure.

Referring to FIG. 1, one embodiment of a crystal oscillator tester 1 of the present disclosure includes a case 10 for accommodating electrical elements. An indicator 20, a crystal oscillator connector 30, and a power switch 40 are arranged on the case 10. In the illustrated embodiment, the case 10 is rectangular, but may be made in other shapes according to need.

Figure 2:
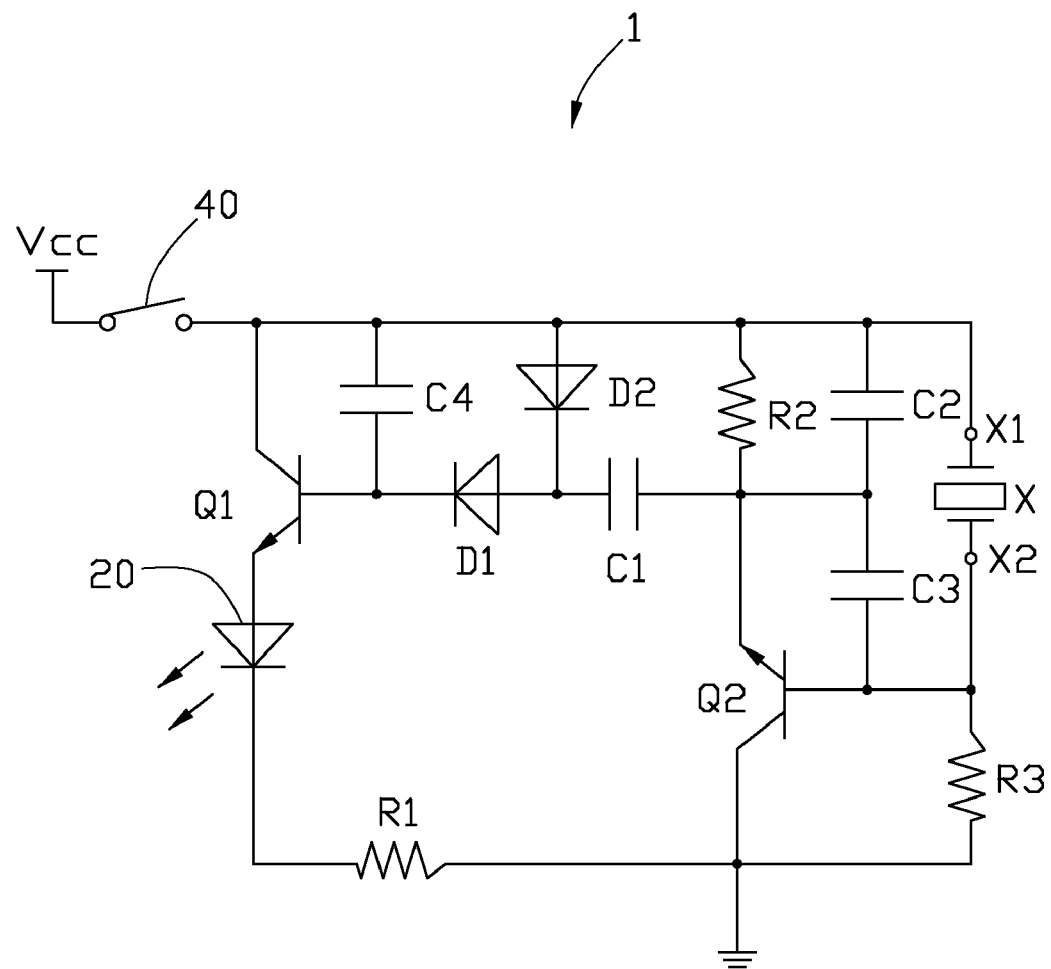
FIG. 2 is a circuit diagram of one embodiment of the crystal oscillator tester of FIG. 1 with a crystal oscillator to be tested.

Referring to FIG. 2, the electrical elements of the crystal oscillator tester 1 include a power source Vcc, a first transistor Q1, a second transistor Q2, a first-third resistors R1-R3 respectively, a first-fourth capacitors C1-C4 respectively, a first diode D1, and a second diode D2. The crystal oscillator connector 30 includes a first test pin X1 and a second test pin X2. In the illustrated embodiment, the first and second transistors Q1 and Q2 are NPN transistors and the indicator 20 is a light-emitting diode (LED). The first and second transistors Q1 and Q2 each include a base, a collector, and an emitter. In other embodiments, the LED can be replaced by another indicator such as a buzzer.

The power source Vcc is connected to the first test pin X1 via the power switch 40. The collector of the first transistor Q1 is connected to the first test pin X1. The emitter of the first transistor Q1 is connected to an anode of the indicator 20. A cathode of the indicator 20 is grounded via the first resistor R1. The base of the first transistor Q1 is connected to a cathode of the first diode D1. The anode of the first diode D1 is connected to the first test pin X1 via the first and second capacitors C1 and C2 one by one in series. The fourth capacitor C4 is connected between the emitter and the base of the first transistor Q1. The anode of the second diode D2 is connected to the first test pin X1. The cathode of the second diode D2 is connected to the anode of the first diode D1. The second resistor R2 is connected between the first test pin X1 and a node between the first and second capacitors C1 and C2. The emitter of the second transistor Q2 is connected to the node between the first and second capacitors C1 and C2. The collector of the second transistor Q2 is grounded. The base of the second transistor Q2 is connected to the second test pin X2. The third capacitor C3 is connected between the base and the emitter of the second transistor Q2. The second test pin X2 is grounded via the third resistor R3.

In one particular embodiment, resistance values of the first-third resistors R1-R3, and capacitance values of the first-fourth capacitors C1-C4 have approximately the following resistance or capacitance value: R1=100Ω, R2=1 KΩ, R3=30 KΩ, C1=1000 pF, C2=150 pF, C3=680 pF, C4=0.0047 μF. However, it may be appreciated that different values of the resistance values of the resistors R1-R3 and capacitance values of the capacitors C1-C3 may vary depending on the embodiment and the crystal oscillator to be tested.

In one particular test, a crystal oscillator X to be tested is inserted into the crystal oscillator connector 30 where two output terminals of the crystal oscillator X are electrically connected to the first and second test pins X1 and X2. When the power switch 40 is in the closed position, the power source Vcc will supply power to the electrical elements of the crystal oscillator tester 1. If the crystal oscillator X is good and its frequency is within a predetermined range, an oscillating circuit comprising the crystal oscillator X, the second capacitor C2, the third capacitor C3, and the second transistor Q2 operates and generates an oscillating signal from the emitter of the second transistor Q2. Then, the oscillating signal is coupled to the first diode D1 via the first capacitor C1, and demodulated to a direct current voltage signal by the first diode D1 to the base of the first transistor Q1. Next, the first transistor Q1 is turned on, thereby the indictor 20 is turned on to indicate the crystal oscillator X is good and its frequency is within the predetermined range. If the crystal oscillator X is bad or its frequency is not within the predetermined range, the oscillating circuit cannot operate to generate the oscillating signal, thereby the indictor 20 is turned off to indicate the crystal oscillator X does is not satisfactory.

In one embodiment, the third resistor R3 may be a damping resistor for steadying the oscillating signal. In one embodiment, the second and third capacitors C2 and C3 may be phase-shifting capacitors, and their capacitances satisfy that: $C2*C3/(C2+C3)=CL-Cs$, where the CL is a load capacitance of the crystal oscillator X, and the Cs is a stray capacitance which is approximate equal to 4-6 pF in one particular embodiment. In other embodiments, a user can test frequencies of different crystal oscillators by adjusting capacitances of the second and third capacitors C2 and C3. The first and second resistors R1 and R2 are current-limiting resistors. The fourth capacitor C4 is a filter capacitor. The second diode D2 is configured for protecting return current from the first capacitor C1. In other embodiments, the first-third resistors R1-R3, the fourth capacitor C4, and the second diode D2 can be omitted as a cost saving measure without departing away from the spirit of the present disclosure. If the first resistor R1 is omitted, the cathode of the indicator 20 is directly grounded. If the second and third resistors R2 and R3, the fourth capacitor C4, and the second diode D2 are omitted and their connection cut off.

It is to be understood, however, that even though numerous characteristics and advantages of the present disclosure have been set forth in the foregoing description, together with details of the structure and function of the invention, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A crystal oscillator tester for testing a crystal oscillator, the tester comprising:
   a first test pin and a second test pin respectively configured for connecting two output terminals of the crystal oscillator, the first test pin connected to a power source;
   a first and a second transistors each having a base, a collector, and an emitter, the collector of the first transistor connected to the first test pin, the base of the second transistor connected to the second test pin;

an indicator, wherein the emitter of the first transistor is grounded via the indicator;

a first diode, wherein the base of the first transistor is connected to a cathode of the first diode; and a first capacitor, a second capacitor, and a third capacitor, an anode of the first diode connected to the first test pin via the first and second capacitors one by one in series, the emitter of the second transistor connected to a node between the first and second capacitors, the collector of the second transistor grounded, the third capacitor connected between the base and the emitter of the second transistor.

2. The crystal oscillator tester of claim 1, further comprising a power switch connected between the power source and the first test pin.

3. The crystal oscillator tester of claim 2, further comprising a crystal oscillator connector configured for inserting the crystal oscillator and connecting the two output terminals of the crystal oscillator to the first and second test pins.

4. The crystal oscillator tester of claim 3, wherein the indicator, the crystal oscillator connector, and the power switch are arranged on a case.

5. The crystal oscillator tester of claim 1, wherein the indicator is a light-emitting diode (LED).

6. The crystal oscillator tester of claim 1, further comprising a fourth capacitor connected between the emitter and the base of the first transistor.

7. The crystal oscillator tester of claim 6, wherein capacitance values of the first-fourth capacitors are about 1000 pF, 150 pF, 680 pF, and 0.0047 µF, respectively.

8. The crystal oscillator tester of claim 1, wherein a first resistor is connected between the indicator and ground, a second resistor is connected between the first test pin and the node between the first and second capacitors, the second test pin is grounded via a third resistor.

9. The crystal oscillator tester of claim 8, wherein the resistances of the first-third resistors are about 100Ω, 1 KΩ, and 30 KΩ, respectively.

10. The crystal oscillator tester of claim 1, further comprising a second diode, an anode of the second diode is connected to the first test pin, an cathode of the second diode is connected the anode of the first diode.

* * * * *